United States Patent
Lee et al.

(10) Patent No.: US 10,509,159 B2
(45) Date of Patent: Dec. 17, 2019

(54) LIGHT SOURCE MODULE AND BACKLIGHT ASSEMBLY HAVING THE SAME

(71) Applicant: Samsung Electronics Co., Ltd., Suwon-si, Gyeonggi-do (KR)

(72) Inventors: Dong-soo Lee, Seongnam-si (KR); Seog-ho Lim, Seongnam-si (KR); Chang-ho Shin, Incheon (KR); Sun Kim, Hwaseong-si (KR); Myoung-sun Ha, Suwon-si (KR); Jae-jun Bang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 409 days.

(21) Appl. No.: 15/407,641

(22) Filed: Jan. 17, 2017

(65) Prior Publication Data
US 2018/0052275 A1 Feb. 22, 2018

(30) Foreign Application Priority Data

Aug. 22, 2016 (KR) .......................... 10-2016-0106176

(51) Int. Cl.
*H01L 25/075* (2006.01)
*F21V 8/00* (2006.01)
(Continued)

(52) U.S. Cl.
CPC .......... *G02B 6/0073* (2013.01); *F21V 19/003* (2013.01); *F21V 23/06* (2013.01);
(Continued)

(58) Field of Classification Search
CPC .... H01L 25/0753; H01L 33/507; H01L 33/62
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| (Continued) | | | |

FOREIGN PATENT DOCUMENTS

| | | |
|---|---|---|
| JP | 10-29036 | 5/1998 |
| JP | 129036 | 5/1998 |
| (Continued) | | |

*Primary Examiner* — Errol V Fernandes
(74) *Attorney, Agent, or Firm* — Harness, Dickey & Pierce, P.L.C.

(57) ABSTRACT

A light source module according to some example embodiments includes a first substrate and a plurality of second substrates. The first substrate includes a plurality of connectors configured to at least receive a supply of electrical power and a plurality of first connection pads that are configured to be electrically connected to the plurality of connectors. The second substrates each include a plurality of mounting elements on an upper surface and a plurality of second connection pads on a lower surface of the second substrate and configured to be electrically connected to the plurality of mounting elements. Each mounting element may be connected to a separate light-emitting device. A plurality of connection members may electrically connect the first connection pads of the first substrate to the plurality of second connection pads of the plurality of second substrates.

19 Claims, 15 Drawing Sheets

(51) Int. Cl.
  *F21V 19/00* (2006.01)
  *F21V 23/06* (2006.01)
  *H01L 33/50* (2010.01)
  *H01L 33/62* (2010.01)
  *F21Y 115/10* (2016.01)
  *H01L 33/48* (2010.01)

(52) U.S. Cl.
  CPC ......... *G02B 6/0053* (2013.01); *G02B 6/0055* (2013.01); *H01L 25/0753* (2013.01); *H01L 33/507* (2013.01); *H01L 33/62* (2013.01); *F21Y 2115/10* (2016.08); *H01L 33/486* (2013.01); *H01L 33/502* (2013.01); *H01L 2224/16225* (2013.01); *H01L 2224/27013* (2013.01); *H01L 2224/73204* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,961,113 B2 | 6/2011 | Rabiner et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,833,965 B2 | 9/2014 | Shimasaki et al. |
| 2012/0267654 A1* | 10/2012 | Lee |
| 2019/0157531 A1* | 5/2019 | Moon |

FOREIGN PATENT DOCUMENTS

| | | |
|---|---|---|
| JP | 3734992 B2 | 1/2006 |
| JP | 2012-234724 A | 11/2012 |
| KR | 10-2011-0077247 A | 7/2011 |
| KR | 10-1154123 B1 | 6/2012 |
| KR | 10-1596892 B1 | 2/2016 |
| KR | 10-1609042 B1 | 4/2016 |

* cited by examiner

LIGHT SOURCE MODULE AND BACKLIGHT ASSEMBLY HAVING THE SAME

CROSS-REFERENCE TO RELATED APPLICATIONS

This application claims the benefit under 35 U.S.C. § 119 of Korean Patent Application No. 10-2016-0106176, filed on Aug. 22, 2016, in the Korean Intellectual Property Office, the disclosure of which is incorporated herein in its entirety by reference.

BACKGROUND

The inventive concepts relate to light source modules and backlight assemblies including one or more light source modules, and more particularly, to light source modules that include a base substrate having a long length along its respective longitudinal axis and a backlight assembly, where the backlight assembly includes a light source module.

Light-emitting devices (e.g., devices that include a light-emitting diode) are next-generation light sources having advantages including long lifespan, low power consumption, fast response rate, and environmental friendly properties compared to those of various light sources and thus have become important light sources in various products including lighting devices or backlights of display devices.

Display devices may include liquid-crystal display devices. A liquid-crystal display device is not configured to self-emit light and thus may include a backlight assembly that is disposed adjacent to a liquid-crystal panel. The backlight assembly may emit light toward a liquid-crystal layer which may include various types of light source modules.

In recent years, backlight assemblies including one or more light source modules that include one or more light-emitting devices having high light efficiency have been studied. Some display devices have a large size, and thus may include a backlight assembly having a long length along its respective longitudinal axis. In some example embodiments, convenience in a preparation process of the backlight assembly needs to be improved.

SUMMARY

The inventive concepts provide a light source module using a light-emitting device and a method of manufacturing the light source module.

The inventive concepts provide a backlight assembly using a light-emitting device and a method of manufacturing the backlight assembly.

According to some example embodiments, a light source module may include a first substrate, a plurality of second substrates, and a plurality of connection members. The first substrate may include a plurality of connectors configured to at least receive a supply of electrical power and a plurality of first connection pads configured to be electrically connected to the plurality of connectors. Each second substrate may be on the first substrate and may include a plurality of light-emitting devices on an upper surface of the second substrate and a plurality of second connection pads on a lower surface of the second substrate, the plurality of second connection pads configured to be electrically connected to the plurality of light-emitting devices. The connection members may electrically connect the plurality of first connection pads of the first substrate with the plurality of second connection pads of the plurality of second substrates.

According to some example embodiments, a light source module may include a first substrate, a plurality of second substrates, and a plurality of connection members. The first substrate may include a plurality of connectors configured to at least receive a supply of electrical power and a plurality of first connection pads configured to be electrically connected to the plurality of connectors. Each second substrate may be on the first substrate and may include a plurality of package substrates on an upper surface of the second substrate, a plurality of light-emitting devices on the plurality of package substrates, each light-emitting device on a separate package substrate of the plurality of package substrates, and a plurality of second connection pads on a lower surface of the second substrate, the plurality of second connection pads configured to be electrically connected to the plurality of light-emitting devices. The connection members may be configured to electrically connect the plurality of first connection pads of the first substrate with the plurality of second connection pads of the plurality of second substrates.

According to some example embodiments, a method of manufacturing a light source module may include: manufacturing a first substrate, the first substrate including a plurality of connectors configured to at least receive a supply of electrical power and a plurality of first connection pads configured to be electrically connected to the plurality of connectors; manufacturing a plurality of second substrates, each second substrate including a mounting element on an upper surface of the second substrate and a plurality of second connection pads on a lower surface of the second substrate, the plurality of second connection pads configured to be electrically connected to the mounting element; mounting a plurality of light-emitting devices on the plurality of the mounting elements of the plurality of second substrate; and mounting the plurality of second substrates on the first substrate such that the plurality of first connection pads of the first substrate are electrically connected to the plurality of second connection pads of the plurality of second substrates.

According to some example embodiments, a backlight assembly may include a first substrate, a plurality of second substrates, and a plurality of connection members. The first substrate may include a plurality of connectors configured to at least receive a supply of electrical power and a plurality of first connection pads configured to be electrically connected to the plurality of connectors. The plurality of second substrates may be on the first substrate and may each include a plurality of light-emitting devices on an upper surface of the second substrate, and a plurality of second connection pads on a lower surface of the second substrate, the plurality of second connection pads configured to be electrically connected to the plurality of light-emitting devices. The connection members may be configured to electrically connect the plurality of first connection pads of the first substrate with the plurality of second connection pads of the plurality of second substrates.

According to some example embodiments, a light source module may include a first substrate, a plurality of second substrates on the first substrate, and a plurality of connection members. The first substrate may include a plurality of connectors configured to at least receive a supply of electrical power and a plurality of first connection pads configured to be electrically connected to the plurality of connectors. Each second substrate may include a plurality of mounting elements on an upper surface of the second substrate, each mounting element configured to electrically connect with a separate light-emitting device, and a plurality of second connection pads on a lower surface of the second substrate, each second connection pad configured to be electrically connected to a separate mounting element of the plurality of mounting elements. The connection members may be configured to electrically connect the plurality of first connection pads of the first substrate with the plurality of second connection pads of the plurality of second substrates.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Hereinafter, the inventive concepts will be described in detail by explaining exemplary embodiments with reference to the attached drawings.

Figure 1:
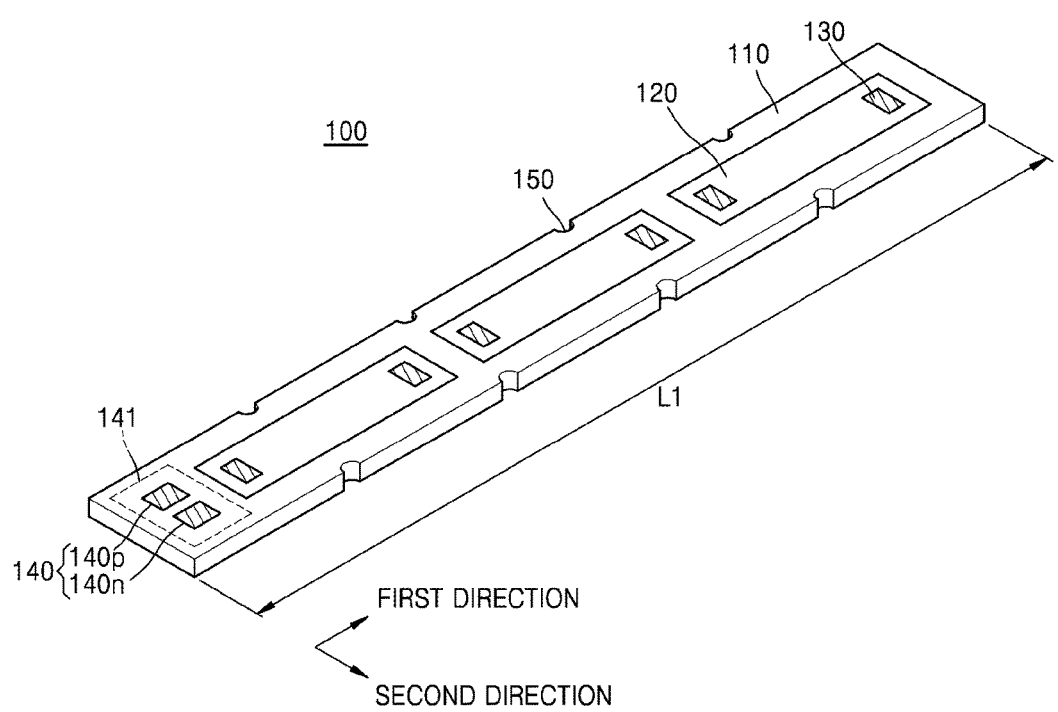
FIG. 1 is a perspective view that illustrates a first substrate of a light source module according to some example embodiments.

FIG. 1 is a perspective view that illustrates a first substrate 100 of a light source module according to some example embodiments.

Referring to FIG. 1, the first substrate 100 may have a bar shape that extends to a particular (or, alternatively, predetermined) length L1 in a longitudinal direction (a first direction).

As used herein, the terms 'top', 'upper part', 'upper surface', 'bottom', 'lower part', 'lower surface', or 'side surface' are used to describe positions in the drawing to which reference is made, but the positions may be changed depending on directions of a light-emitting device, a light source module, a backlight assembly, and/or a lighting device that are arranged.

The first substrate 100 may include a plurality of first mounting elements 120 positioned on a substrate upper surface 110; a plurality of first connection pads 130 positioned in the first mounting elements 120; and a plurality of connectors 140 located in an area around at least one of both ends (e.g., at least one end region 141) of the substrate upper surface 110.

The first substrate 100 may be a circuit board, for example, a printed circuit board (PCB) or a flexible PCB that may be easily modified, wherein the first substrate 100 may be formed of (e.g., may at least partially comprise) an organic resin material containing epoxy, triazine, silicon, and polyimide; and other organic resin material. In some example embodiments, the first substrate 100 may include a silicon nitride layer, a ceramic material such as AlN or $Al_2O_3$, or a metal or a metal compound such as metal core printed circuit board (MCPCB) or metal-based copper clad laminate (MCCL).

The first substrate 100 may have a solid or flexible plate structure in a long rectangular shape having a particular (or, alternatively, predetermined) length L1 in a longitudinal direction (a first direction). For example, the first substrate 100 may have a structure which is compliant with the Zhaga standards for a module.

In some example embodiments, electrically connected portions may, for example, serve as an upper part protection layer as an insulating layer is formed on the entire surface of the substrate upper surface 110 except on the first connection pads 130 and the connectors 140.

The first substrate 100 may be a single layer circuit board having interconnections on one surface. That is, interconnections for the first connection pads 130 and the connectors 140 are formed only on the substrate upper surface 110, and a lower surface of the first substrate 100 may have no interconnection formed thereon. Using a single layer circuit board as the first substrate 100 may be economically preferable in terms of the manufacturing cost compared to using a double layer circuit board as the first substrate 100 because the cost of manufacturing a single layer circuit board is lower than the cost of manufacturing a double layer circuit board.

The first substrate 100 is not limited to a structure or a material of the substrates described above. For example, the first substrate 100 may be formed of (e.g., may at least partially comprise) a metal material such that the first substrate 100 is configured to have improved heat-releasing characteristics.

The first substrate 100 may include a plurality of first mounting elements 120 extending along a longitudinal axis of the first substrate 100 (e.g., extending in a longitudinal direction (a first direction)). The first mounting elements 120 may be in a plural number ("quantity") on the substrate upper surface 100 along a longitudinal axis of the first substrate 100. Each of the first mounting elements 120 may include a plurality of first connection pads 130 each located in an area that is proximate to at least one end of both ends of the first mounting element 120. The first mounting elements 120 may be configured to couple with a second substrate 200 (see FIG. 2), as described later. A mounting element 120 may include one or more connection elements configured to engage with at least a portion of a second substrate 200 to connect with the second substrate 200. A second substrate 200 may be mounted on a mounting element 120. A mounting element 120 and may be defined by division lines, as shown in FIG. 1, or may not be defined by division lines.

The connectors 140 are equipped for transmitting (e.g., are configured to supply) electrical signals to the outside (e.g., one or more elements that are external to the first substrate 100) and/or for power supply (e.g., configured to supply and/or receive electrical power) and at least one of the connectors 140 may be positioned around at least one of both ends of the substrate upper surface 110. In FIG. 1, the connectors 140 are positioned in an end region 141 of the first substrate 100, where the end region 141 is proximate to one end of the substrate upper surface 110, but embodiments are not limited thereto, and the connectors 140 may be positioned around each of both ends of the substrate upper surface 110. The connectors 140 may include an external connection terminal for supplying power to a light-emitting device 300 (see FIG. 4), as described later, through the first connection pads 130 of each of the first mounting elements 120. The connectors 140 may each include a positive electrode connector 140p that is connected to a positive electrode power source; and a negative electrode connector 140n that is connected to a negative electrode power. The connectors 140 may be configured to be electrically connected to the first connection pads 130. Similarly, the first connection pads 130 may be configured to be electrically connected to the plurality of connectors 140.

In some example embodiments, the first substrate 100 may be a substrate of a light source module of a backlight assembly (e.g., may be configured to be a substrate of a light source module of a backlight assembly). In some example embodiments, the first substrate 100 may include a coupling unit 150 to which a backlight assembly of a light source is mounted, and the coupling unit 150 may be, for example, grooves formed in a side surface of the first substrate 100.

Figure 2:
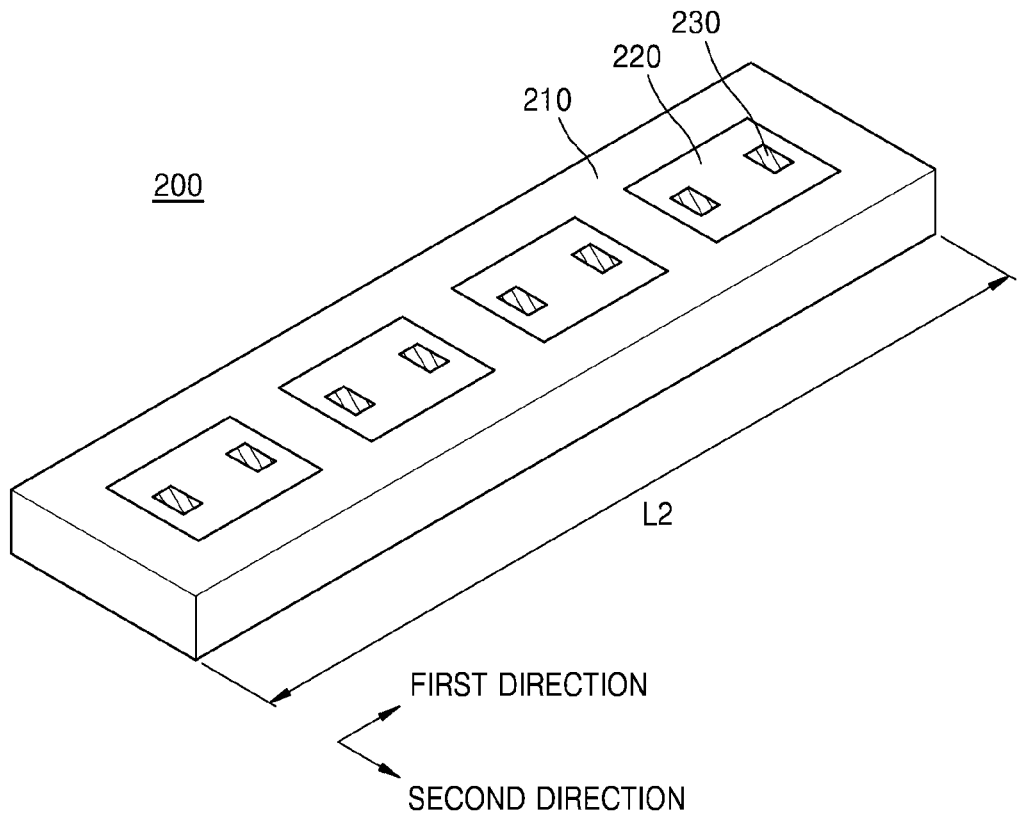
FIG. 2 is a perspective view that illustrates a second substrate of a light source module according to some example embodiments.

FIG. 2 is a perspective view that illustrates a second substrate 200 of a light source module according to some example embodiments.

Referring to FIG. 2, the second substrate 200 may have a bar shape that extends to a particular (or, alternatively, predetermined) length L2 along a longitudinal axis of the second substrate 200 (e.g., in a longitudinal direction (a first direction) of the second substrate 200).

The second substrate 200 may include a plurality of second mounting elements 220 positioned on a substrate upper surface 210; and a plurality of upper connection pads 230 positioned in the second mounting elements 220. A mounting element 220 may include one or more connection elements configured to engage with at least a portion of a light-emitting device to connect with the light-emitting device.

The second substrate 200 may be a circuit board, for example, a PCB. If and/or when the second substrate 200 is a PCB, a body layer may be generally prepared by compressing a polymer material such as a thermosetting resin, an epoxy-based resin or a phenol resin such as Flame Retardant 4 (FR-4), Bismaleimide Triazine (BT), or Ajinomoto Build up Film (ABF) in a constant thickness to form a thin film, coating both surfaces of the thin film with a copper foil, and forming an interconnection pattern, which becomes a transmission pathway of an electrical signal by the patterning process.

In some example embodiments, the second substrate 200 may have interconnection patterns in the substrate upper surface 210 and a substrate lower surface 215 (see FIG. 3) that may be electrically connected to each other by vias that are formed through the body layer (e.g., extend at least partially through the body layer). Coating a whole lower surface and a whole upper surface of the body layer with a solder resist, except the electrically connected regions, for example, connection pads and external connection members, may form a lower protection layer and an upper protection layer.

The second substrate 200 may be a double layer PCB. That is, interconnections for the upper connection pads 230 for electrical connection with a plurality of light-emitting devices 300 (see FIG. 4) may be formed on the substrate upper surface 210, and interconnections for a second connection pad 240 (see FIG. 3) for electrical connection with the first substrate 100 may be formed on the substrate lower surface 215.

In some example embodiments, the number ("quantity") of layers of the copper film may be 3 or more by using prepreg, which is an insulating material, and when 3 or more interconnection layers are formed on the corresponding number of layers of the copper film, a multi-layered wiring PCB may be manufactured. However, the second substrate 200 is not limited a structure or a material of the PCB described above. For example, the second substrate 200 may be MCPCB, MPCB, or FPCB.

The second substrate 200 may be a PCB having a relatively short length which may be a particular (or, alternatively, predetermined) length L2 in a longitudinal direction (a first direction) of the second substrate 200 (e.g., along a longitudinal axis of the second substrate 200). The length L2 of the second substrate 200 may be shorter than the length L1 of the first substrate 100. For convenience of description, a width and a thickness of the second substrate 200 in FIG. 2 are different from a width and a thickness of the first substrate 100 in FIG. 1, but a width and a thickness of the second substrate 200 may be substantially the same as a width and a thickness of the first substrate 100, respectively.

The second substrate 200 may include a plurality of second mounting elements 220. The second mounting elements 220 may be in a plural number ("quantity") on the substrate upper surface 210 and the plurality of mounting elements may extend along the longitudinal axis of the second substrate 200 (e.g., in a longitudinal direction of the second substrate 200). Each of the second mounting elements 220 may include upper connection pads 230 each positioned around each of both ends thereof. The second mounting elements 220 may be configured to connect with separate light-emitting devices 300, as described later. Each mounting element 220 may be configured to enable a light-emitting device 300 to be mounted on the mounting element 220 and may be defined by division lines, as shown in FIG. 1, or may not be defined by division lines. Although it will be described later, the division lines may be formed by a protrusion unit 410 (see FIG. 9).

Figure 3:
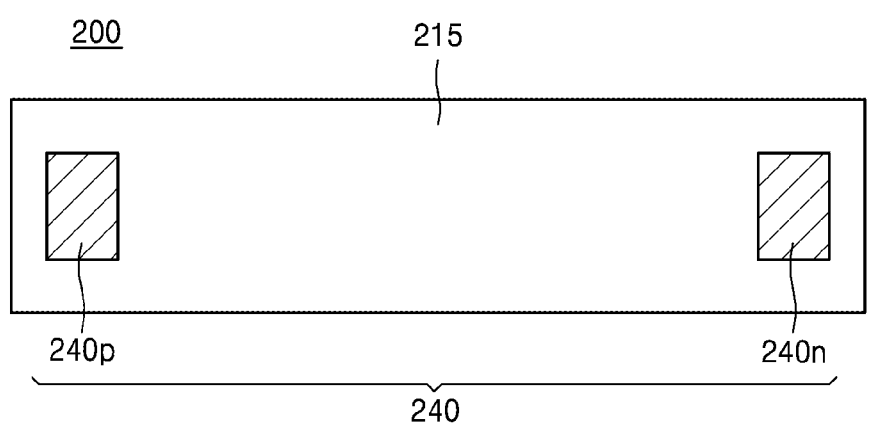
FIG. 3 is a bottom plan view that illustrates a lower surface of the second substrate of a light source module according to some example embodiments.

FIG. 3 is a bottom plan view that illustrates a lower surface of the second substrate 200 of a light source module according to some example embodiments.

Referring to FIG. 3, the substrate lower surface 215 of the second substrate 200 may include a second connection pad 240 via which the first substrate 100 may be electrically connected (see FIG. 1). The second connection pads 240 may be configured to be electrically coupled to one or more of the upper connection pads 230 of the mounting elements 220, such that the second connection pads 240 may be configured to be electrically coupled to one or more of the mounting elements 220.

As described above, the second substrate 200 may be a double layer PCB having interconnections on both surfaces, and the interconnections formed on the substrate lower surface 215 of the second substrate 200 connect the first substrate 100 with the outside.

The second connection pads 240 may be configured to be electrically connected to the first connection pads 130 of the first substrate 100 (see FIG. 1). The second connection pads 240 may each include a second positive electrode connection pad 240p that is configured to be electrically connected to a positive electrode power source; and a second negative electrode connection pad 240n that is configured to be electrically connected to a negative electrode power source. A plurality of second connection members 250 (see FIG. 8) such as solder balls or solder bumps may be mounted on the second connection pads 240.

The second connection pads 240 may be a metal layer of gold (Au), copper (Cu), silver (Ag), or aluminum (Al). For example, the second connection pads 240 may be formed of a conductive material including copper (Cu). In this case, when the copper (Cu) in the second connection pads 240 is exposed to air, an oxidation layer may be formed on surfaces of the second connection pads 240, which disturb soldering, and thus solder balls or solder bumps may not be properly mounted on the second connection pads 240 of the second substrate 200. Thus, in order to mount solder balls or solder bumps on the second connection pads 240 without defects, the second connection pads 240 may be surface-treated for preventing formation of an oxidation layer.

Figure 4:
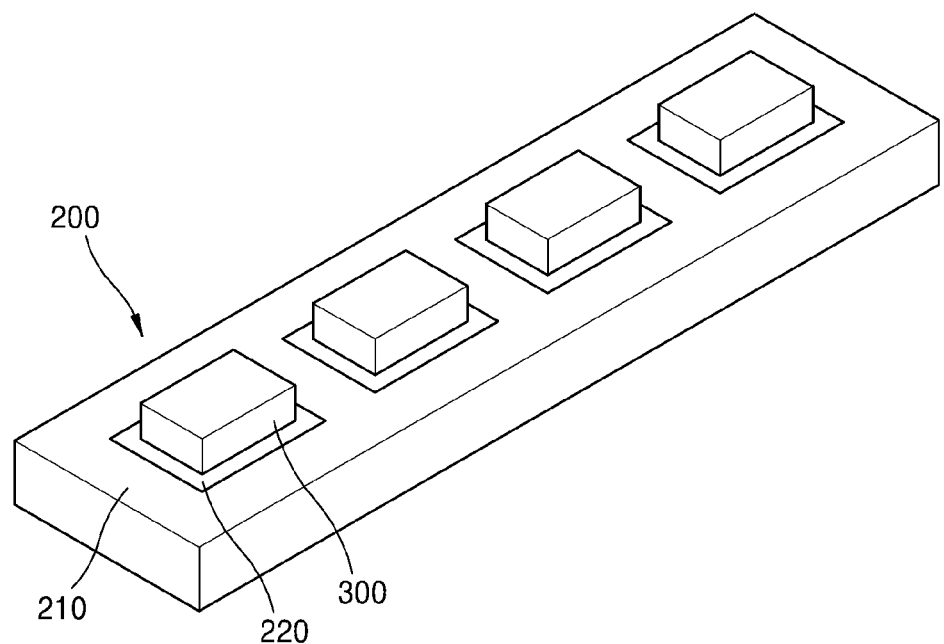
FIG. 4 is a schematic perspective view that illustrates a light-emitting device that is mounted on an upper surface of the second substrate of a light source module according to some example embodiments.

FIG. 4 is a schematic perspective view that illustrates a plurality of light-emitting devices 300 mounted on an upper surface of the second substrate 200 of a light source module according to some example embodiments.

Referring to FIG. 4, the light-emitting devices 300 may be mounted in the second mounting elements 220 that are defined on the substrate upper surface 210 of the second substrate 200.

In some example embodiments, the light-emitting device 300 may be in a plural number ("quantity"), and thus a plurality of the light-emitting devices 300 may be separately arranged in a row at a constant or substantially constant interval (e.g., a constant interval within manufacturing tolerances and/or material tolerances) on the substrate upper surface 210 of the second substrate 200. In some example embodiments, a plurality of the light-emitting devices 300 may be arranged in a plurality of rows. In some example embodiments, a plurality of the light-emitting devices 300 may be arranged in a line, in a curve, or in a particular (or, alternatively, predetermined) pattern. As shown in FIG. 4, the mounting elements 220 may extend along a longitudinal axis of the second substrate 200, such that the plurality of light-emitting devices 300 may extend along the longitudinal axis of the second substrate.

The light-emitting devices 300 may be electrically connected to the upper connection pads 230 (see FIG. 2) in the second substrate 200. The light-emitting device 300 may be any light-emitting device that is configured to generate light of a particular (or, alternatively, predetermined) wavelength by externally supplied driving power. A light-emitting device 300 may include one or more light-emitting diodes (LEDs). The light-emitting device 300 may include multiple light-emitting devices, as described later with reference to FIGS. 5 to 7.

More details about the light-emitting device 300 will be described later. A light-emitting device 300 may be configured to emit blue light, green light, or red light based on one or more materials and/or one or more fluorescent materials included in the light-emitting device 300. In some example embodiments, a light-emitting device may be configured to emit white light and/or UV light.

In FIG. 4, the light-emitting devices 300 are each mounted on a separate one of the second mounting elements 220. However, example embodiments are not limited thereto, and a plurality of the light-emitting devices 300 may be mounted on each of the second mounting elements 220. In some example embodiments, all light-emitting devices 300 may be mounted on one second mounting element 220.

Figure 5:
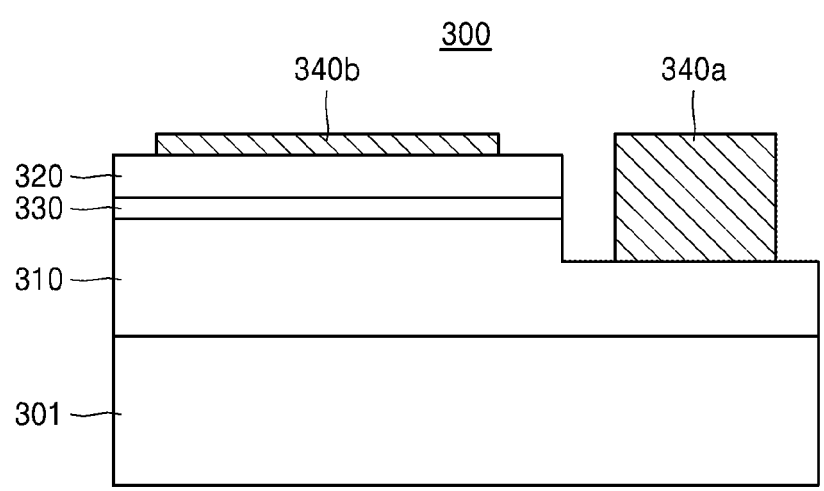
FIG. 5, FIG. 6, and FIG. 7 are each a cross-sectional view that illustrates a light-emitting device that may be included in a light source module according to some example embodiments.
Figure 6:
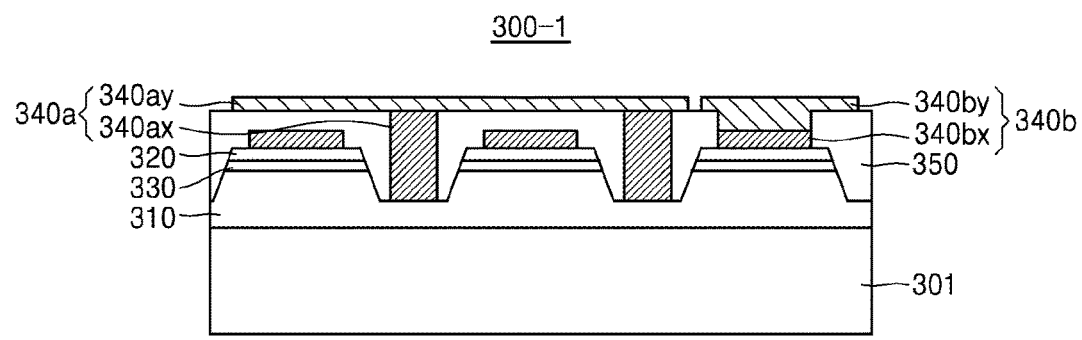
Figure 7:
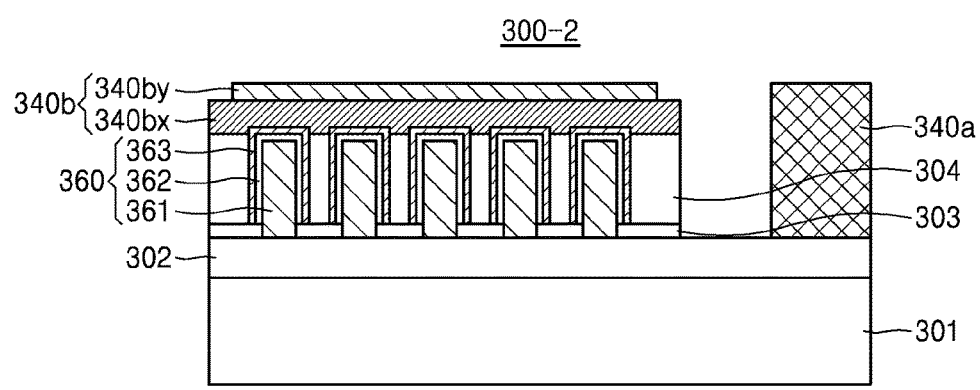

FIG. 5, FIG. 6, and FIG. 7 are each a cross-sectional view that illustrates a light-emitting device that may be included in a light source module according to some example embodiments.

Referring to FIG. 5, the light-emitting device 300 may include a plurality of first conductive semiconductor layers 310 that are sequentially stacked on a supporting substrate 301; an active layer 330; a plurality of second conductive semiconductor layers 320; a first electrode pad 340a; and a second electrode pad 340b.

The plurality of first conductive semiconductor layers 310 that are sequentially stacked on the supporting substrate 301 may be an n-type nitride semiconductor layer doped with an n-type impurity. In some example embodiments, the plurality of second conductive semiconductor layers 320 may be a p-type nitride semiconductor layer doped with a p-type impurity. However, in some example embodiments, the positions of the first and second conductive semiconductor layers 310 and 320 may be switched with each other. The first and second conductive semiconductor layers 310 and 320 may have a formula of $Al_xIn_yGa_{(1-x-y)}N$ (where $0 \leq x<1$, $0 \leq y<1$, and $0 \leq x+y<1$), and examples of a material for the first and second conductive semiconductor layers 310 and 320 may include GaN, AlGaN, InGaN, and AlInGaN.

The active layer 330 disposed between the first and second conductive semiconductor layers 310 and 320 may emit light having particular (or, alternatively, predetermined) energy due to recombination of electrons and holes. The active layer 330 may include a material having an energy band gap that is less than an energy band gap of the first and second conductive semiconductor layers 310 and 320. For example, when the first and second conductive semiconductor layers 310 and 320 are a GaN-based compound semiconductor, the active layer 330 may include an InGaN-based compound semiconductor having an energy band gap that is less than an energy band gap of GaN.

In some example embodiments, the active layer 330 may have a multiple quantum well structure, for example, an InGaN/GaN structure, in which quantum well layers and quantum barrier layers are alternately stacked. However, example embodiments are not limited thereto, and the active layer 330 may have a single quantum well structure.

The light-emitting device 300 may include the first and second electrode pads 340a and 340b that are configured to be electrically connected to the first and second conductive semiconductor layers 310 and 320, respectively. In some example embodiments, in order to manufacture a structure of a chip on board type by flip-chip bonding, the first and second electrode pads 340a and 340b may be exposed and disposed in the same direction on one surface of the light-emitting device 300. Here, the one surface of the light-emitting device 300 may be defined as a mounting surface on which the light-emitting device 300 is subjected to be mounted on the second substrate 200 (see FIG. 4).

Referring to FIG. 6, the light-emitting device 300-1 may include a semiconductor stack structure on a supporting substrate 301. The semiconductor stack structure may include a first conductive semiconductor layer 310, an active layer 330, and a second conductive semiconductor layer 320.

The light-emitting device 300-1 includes the first and second electrode pads 340a and 340b that are electrically connected to the first and second conductive semiconductor layers 310 and 320, respectively. The first electrode pad 340a may include a conductive via 340ax that is electrically connected to the first conductive semiconductor layer 310 through the second conductive semiconductor layer 320 and the active layer 330; and an electrode extension 340ay that is connected to the conductive via 340ax.

The conductive via 340ax may be surrounded by an insulating layer 350 and thus may be electrically separated from the second conductive semiconductor layer 320. The conductive via 340ax may be formed in an area where the semiconductor stack structure is etched. The number, shape, pitch, or contact area of conductive vias 340ax may be appropriately designed with respect to the first conducive semiconductor layer 310 to decrease contact resistance. In some example embodiments, the conductive vias 340ax may be arranged in rows and columns on the semiconductor stack structure to increase current flow. The second electrode pad 340b may include an ohmic contact layer 340bx and an electrode extension 340by on the second conductive semiconductor layer 320.

Referring to FIG. 7, the light-emitting device 300-2 may include a supporting substrate 301; a first conductive base layer 302 disposed on the supporting substrate 301; a plurality of nano light-emitting structures 360 disposed on the first conductive base layer 302; an insulating layer 303, and a filling 304.

Each of the nano light-emitting structures 360 includes a first conductive semiconductor core 361; and an active layer 362 and a second conductive semiconductor layer 363 that are sequentially stacked as shell layers on a surface of the first conductive semiconductor core 361.

In some example embodiments, the nano light-emitting structures 360 have a core-shell structure as an example. However, example embodiments are not limited thereto, and the nano light-emitting structures 360 may have a different structure such as a pyramid structure. The first conductive semiconductor base layer 302 may be a layer that provides a growing surface of the nano light-emitting structures 360. The insulating layer 303 provides an open area for growth of the nano light-emitting structures 360, and the insulating layer 303 may be formed of a dielectric material such as a silicon oxide layer, a silicon nitride layer, or a silicon nitrate layer.

The filling 304 may structurally stabilize the nano light-emitting structure 360 and may transmit or reflect light. When the filling 304 includes a light-permeable material, the filling 304 may be a transparent material such as a silicon oxide layer, a silicon nitride layer, a silicon nitrate layer, an elastic resin, silicon, an epoxy resin, a polymer, or plastic. In some example embodiments, when the filling 304 includes a reflective material, the filling 304 may be prepared by using metal powder or ceramic powder having high reflectivity in a polymer material such as polyphthalamide (PPA). The ceramic powder having high reflectivity may be at least one selected from the group consisting of $TiO_2$, $Al_2O_3$, $Nb_2O_5$, $Al_2O_3$, and ZnO. In some example embodiments, a highly reflective metal may be used to prepare the filling 304, and an example of the highly reflective metal may be aluminum (Al) or silver (Ag).

The first and second electrode pads 340a and 340b may be disposed on an upper surface of the nano light-emitting structures 360. The first electrode pad 340a may be positioned on an exposed upper surface of the first conductive semiconductor base layer 302, and the second electrode pad 340b may include an ohmic contact layer 340bs and an electrode extension 340by on the nano light-emitting structures 360 and the filling 304. In some example embodiments, the ohmic contact layer 340bx and the electrode extension 340by may be integrated to one body.

Figure 8:
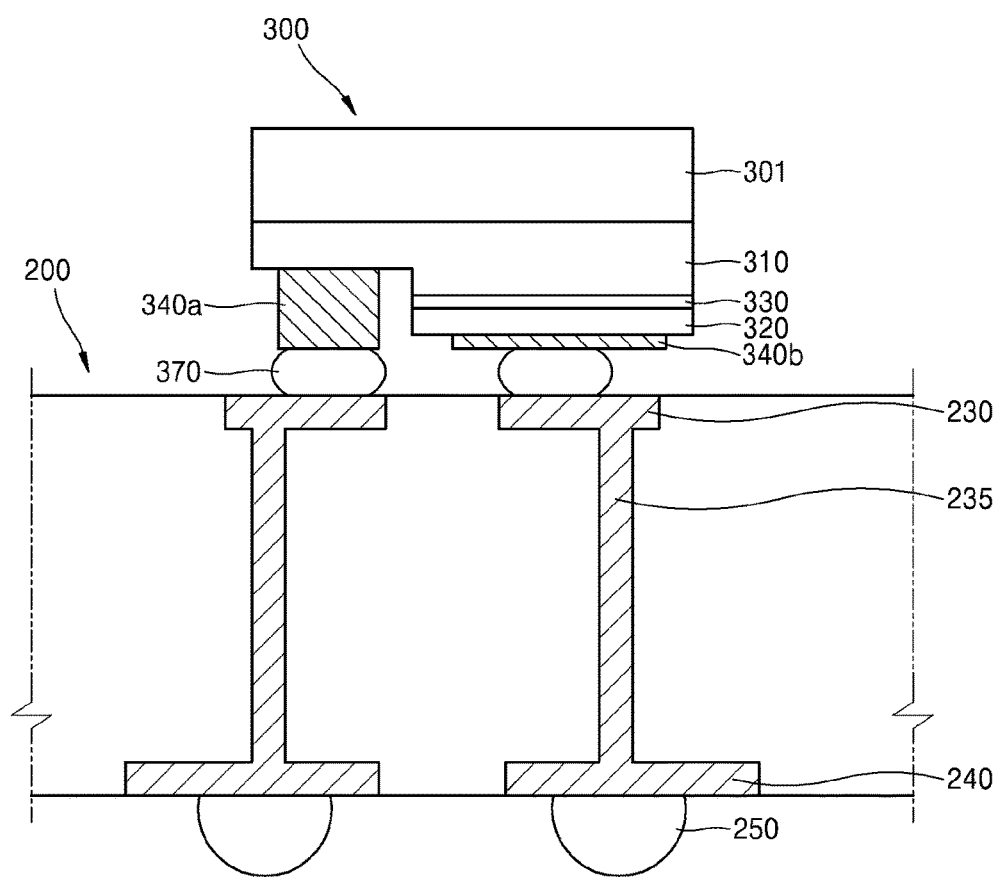
FIG. 8 and FIG. 9 are each a cross-sectional view that illustrates a light-emitting device mounted on the upper surface of the second substrate of a light source module according to some example embodiments.
Figure 9:
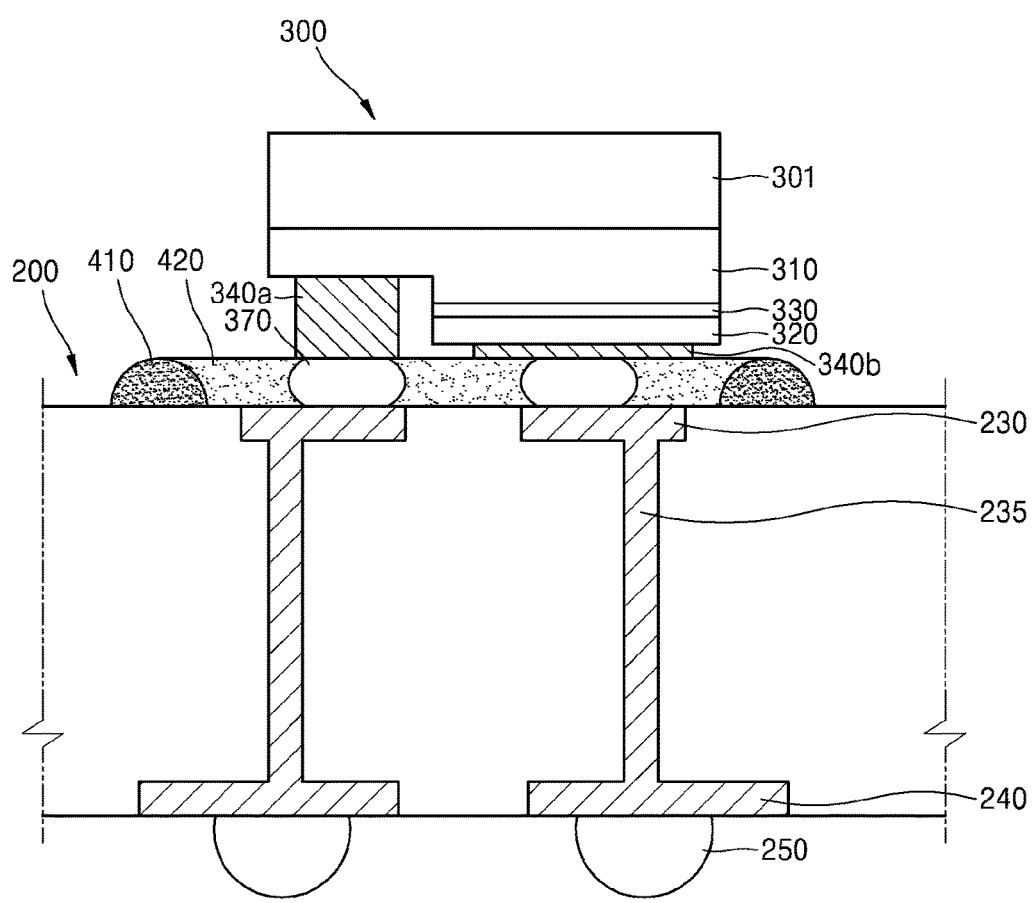

FIG. 8 and FIG. 9 are each a cross-sectional view that illustrates a light-emitting device mounted on the upper surface of the second substrate of a light source module according to some example embodiments.

Referring to FIG. 8, first connection members 370 are mounted on the substrate upper surface 210 of the second substrate 200 so that the upper connection pads 230 and the light-emitting device 300 are electrically connected through the first connection members 370, and the second connection members 250 are on the second connection pads 240 of the substrate lower surface 215 of the second substrate 200.

The light-emitting device 300 may include electrode pads 340a and 340b that are configured to be electrically connected to the first and second conductive semiconductor layers 310 and 320, respectively. The light-emitting device 300 may be mounted on and thus may be electrically connected to the second substrate 200 through the first connection members 370, or, for example, solder balls or solder bumps, that connect the electrode pads 340a and 340b and the upper connection pads 230 by flip-chip bonding.

A cross-sectional view of the second substrate 200 is a cross-sectional view of a double layer PCB, in which the upper connection pads 230 overlap vias 235, and the second connection pads 240, on which the second connection members 250 are positioned, overlap the vias 235 therebelow. For example, the upper connection pads 230, the vias 235, and the second connection pads 240 are sequentially stacked on an insulating layer. The upper connection pads 230 and the second connection pads 240 are configured to be electrically connected to each other by the vias 235. In some example embodiments, after exposing only connection areas, the upper connection pads 230 and the second connection pads 240 are each covered by a solder resist. The exposed connection areas of the second connection pads 240 are areas where the second connection members 250 such as solder balls or solder bumps are attached thereon after the surface treatment, and the exposed connection areas of the upper connection pads 230 are areas where the first connection members 370 such as solder balls or solder bumps are attached thereon after the surface treatment.

A size of the first connection members 370 may be less than a size of the second connection members 250. Therefore, the exposed connection areas of the upper connection pads 230 may be smaller than the exposed connection areas of the second connection pads 240. Despite the difference in the sizes of the exposed connection areas, the upper connection pads 230 and the second connection pads 240 may perform the same function.

Although FIG. 8 shows a PCB having two metal layers, the number of metal layers may be at least 3 or 4 depending on the need, and thus the PCB may have a further complicated structure.

Referring to FIG. 9, protruding units 410 and resin units 420 fill a space between the light-emitting device 300 and the second substrate 200.

The resin units 420 are formed when a resin contains a high thermal conductive filler or a high light-reflective filler or when a high thermal conductive filler or a high light-reflective filler are contained in a resin. In some example embodiments, the resin units 420 may fill a space between the light-emitting device 300 and the second substrate 200 by an underfill process.

In some example embodiments, the protruding units 410 may be on the substrate upper surface 210 of the second substrate 200 and define areas on which the resin units 420 are formed. Therefore, the resin units 420 that fill the space between the light-emitting device 300 and the second substrate 200 by an underfill process may not overflow to the outside and may be formed within the area limited by the protruding units 410. Starting parts and ending parts of the protruding units 410 may contact each other so that the resin units 420 do not leak out of the protruding units 410. That is, the protruding units 410 may have a shape of a closed curve. In some example embodiments, the protruding units 410 may define the second mounting elements 220 (see FIG. 2).

Figure 10:
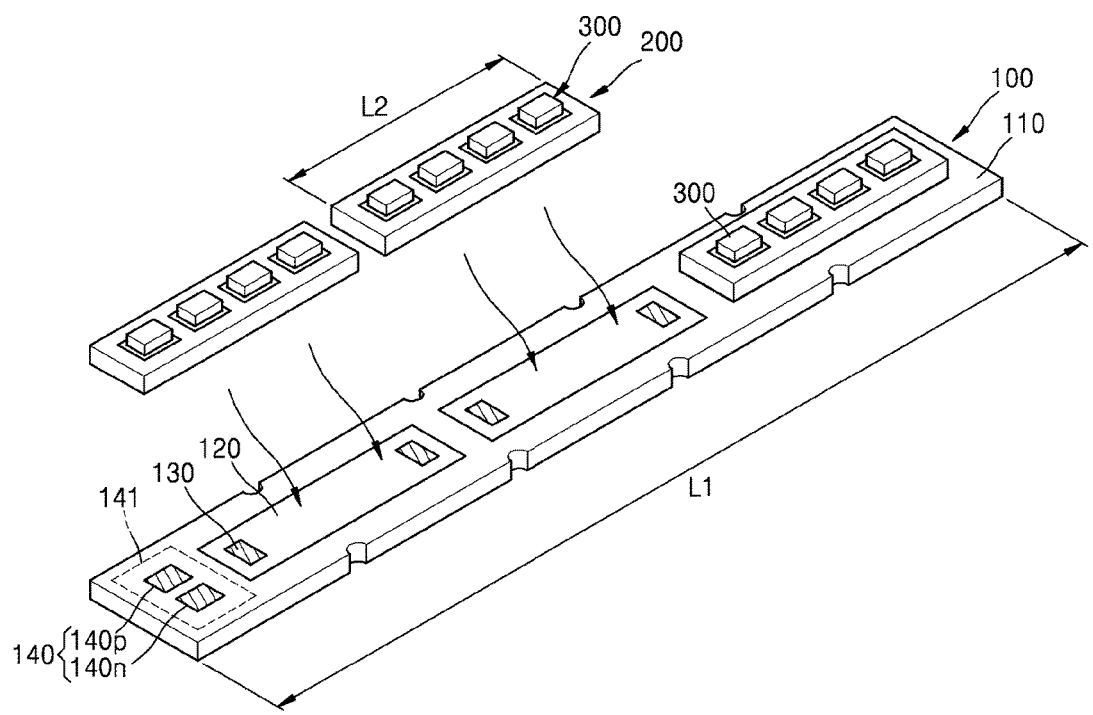
FIG. 10 is a perspective view that illustrates mounting of a plurality of second substrates on an upper surface of the first substrate of a light source module according to some example embodiments.

FIG. 10 is a perspective view that illustrates mounting of a plurality of second substrates 200 on an upper surface of the first substrate 100 of a light source module according to some example embodiments.

Referring to FIG. 10, in order to manufacture a light source module, a plurality of second substrates 200 having a plurality of light-emitting devices 300 equipped thereon may be mounted on an upper surface 110 of a first substrate 100 having circuit interconnections formed thereon by using surface mounting technology in a longitudinal direction of the first substrate 100.

The surface mounting technology may include a fluxing process, a mounting process, a reflow process, and an underfill process. Flux is coated on the second connection members 250 (see FIG. 12) respectively formed on the second connection pads 240 (see FIG. 12) of the second substrate 200 through the fluxing process. The second substrate 200 including the flux coated second connection members 250 is mounted on the first substrate 100 through the mounting process. During the mounting process, the second connection members 250 are exactly connected with the first connection pads 130 on the substrate upper surface 110 of the first substrate 100 and the second substrate 200 is mounted within the first mounting element 120.

After mounting each of the second substrates 200 on the first substrate 100, the second connection members 250 may be chemically bonded with the first connection pads 130 through a reflow process. The reflow process may include a process of heating the second connection members 250 to a melting temperature of a material forming the second connection members 250 or higher. The second connection members 250 may each form an intermetallic compound with the first connection pad 130 through a reflow process and thus may form a further stable bond.

Since the second substrate 200 is mounted on the first substrate 100 by using surface mounting technology, a mounting margin may be reduced than when the second substrate 200 is mounted on the first substrate 100 by using bonding interconnection technology or connection technology using interconnections that are generally used in the art. In some example embodiments, a manufacturing task may be performed by using a surface mounting apparatus used in the manufacture of a semiconductor, and thus manufacturing efficiency may increase and a defect ratio may decrease.

In FIG. 10, the second substrates 200 are mounted on the first substrate 100 one at a time. However, example embodiments are not limited thereto, and a plurality of the second substrates 200 may be mounted on the first substrate 100 at once. In some example embodiments, FIG. 10 shows that three of the second substrates 200 are mounted on the first substrate 100, but embodiments are not limited thereto, and at least two or four second substrates 200 may be mounted on the first substrate 100.

Figure 11:
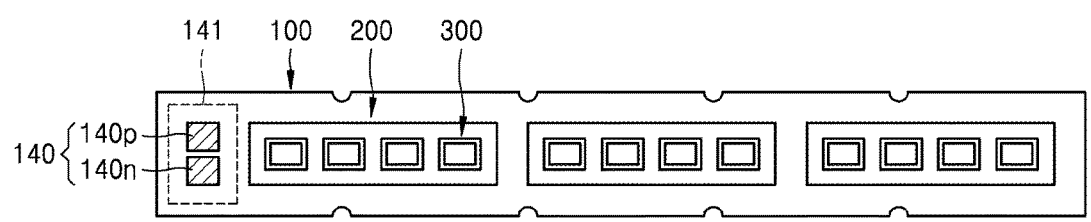
FIG. 11 is a plan view that illustrates the plurality of second substrates mounted on the upper surface of the first substrate of a light source module according to some example embodiments.

FIG. 11 is a plan view that illustrates the plurality of second substrates 200 mounted on the upper surface of the first substrate 100 of a light source module according to some example embodiments.

Referring to FIG. 11, the second substrates 200 equipped with the light-emitting device 300 are mounted on the substrate upper surface 110 of the first substrate 100 in a longitudinal direction of the first substrate 100, and thus a light source module having a long length along its respective longitudinal axis is prepared.

According to some example embodiments, provided is a long-axis light source module that is prepared by mounting the light-emitting devices 300 on the second substrates 200, which are a double layer PCB having a relatively short length along a respective longitudinal axis in the form of a chip, by using flip-chip bonding technology and mounting the second substrates 200 on the first substrate 100 having a relatively long length along a respective longitudinal axis by using surface mounting technology.

Display devices such as a TV, a monitor, and a touch panel have been manufactured in large sizes, and thus a light source module and a backlight assembly having high light intensity and high efficiency is needed in the market. In some example embodiments, according to an increased application of light-emitting devices in a lighting device, line-emission or surface-emission of a large surface area is needed.

In order to be used as a component of a large-sized display device or a large-sized lighting device, a light source module having a long length along its respective longitudinal axis with a plurality of light-emitting devices mounted thereon is preferable in terms of manufacturing efficiency. However, a conventional process apparatus capable of performing a surface mounting process has low accuracy to manufacture a light source module having a long length along its respective longitudinal axis, and manufacturing a process apparatus for a light source module having a long length along its respective longitudinal axis requires a high cost. That is, a light source module having a short length along its respective longitudinal axis may be manufactured by using a conventional process apparatus capable of performing a surface mounting process, but a manufacturing process of a light source module having a long length along its respective longitudinal axis is difficult.

In order to resolve the problem, according to some example embodiments, a plurality of light source modules having a short length along its respective longitudinal axis (e.g., second substrates 220 on which light-emitting devices 300 are mounted) are extended by using a base substrate (e.g., first substrate 100) having a long length along its respective longitudinal axis, and thus substantially the same effect produced by a light source module having a long length along its respective longitudinal axis may be expected. In some example embodiments, since a light source module having a long length along its respective longitudinal axis may be manufactured by using a conventional process apparatus capable of performing a surface mounting process, a light source module and a backlight assembly having high light intensity and high efficiency may be manufactured with a reduced cost.

In some example embodiments, manufacturing efficiency of the light source module may increase than those of light source modules prepared by using bonding interconnection technology or connection technology using interconnections that are generally used in the art, and a mounting margin may be reduced by using a surface mounting apparatus that is used in the manufacture of a semiconductor.

Figure 12:
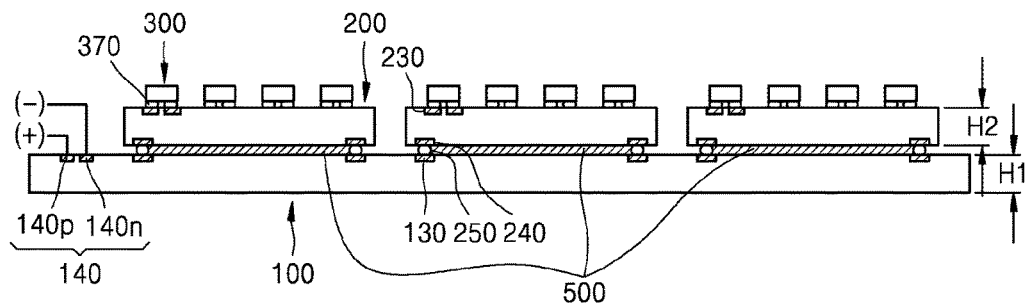
FIG. 12 is a cross-sectional view that illustrates the plurality of second substrates mounted on the upper surface of the first substrate of a light source module according to some example embodiments.

FIG. 12 is a cross-sectional view that illustrates the plurality of second substrates 200 mounted on the upper surface of the first substrate 100 of a light source module according to some example embodiments.

Referring to FIG. 12, the light-emitting devices 300 are mounted on the second substrates 200 by using flip-chip bonding technology, and the second substrates 200 are mounted on the first substrate 100 in a longitudinal direction of the first substrate 100 (e.g., along a longitudinal axis of the first substrate 100) by using surface mounting technology.

The light-emitting devices 300 may emit light in a direction opposite to the direction in which the first substrate 100 is configured. Interconnections in the first substrate 100 and the second substrate 200 may be arranged parallel to each other such that each of the light-emitting devices 300 may operate independently, the interconnections of the first substrate 100 and the second substrate 200 may be arranged such that the light-emitting devices 300 mounted on the same second substrate 200 may operate at the same time, or the interconnections of the first substrate 100 and the second substrate 200 may be arranged such that all the light-emitting devices 300 may operate at the same time.

A plurality of the connectors 140 may be adjacent to one end of the first substrate 100, and each of the connectors 140 includes a positive electrode connector 140p that is connected to a positive electrode (+), which is an external power source; and a negative electrode connector 140n that is connected to a negative electrode (−), or the positive electrode connector 140p and the negative electrode connector 140n may be adjacent to both ends of the first substrate 100, respectively. In some example embodiments, structures or positions of the connectors 140 may change according to a structure of the internal interconnections and a display device to which the light source module is applied.

According to a structure of the internal interconnections formed on the first substrate 100 and the second substrate 200, a thickness H1 of the first substrate 100 and a thickness H2 of the second substrate 200 may be changed. In some example embodiments, according to a material that forms the first substrate 100 and the second substrate 200, each of the thicknesses H1 and H2 may be changed.

In some example embodiments, according to a structure of the internal interconnections formed on the first substrate 100 and the second substrate 200, the number and positions of the first connection pads 130 and the second connection pads 240 may be changed. In FIG. 12, each of the second substrates 200 has two second connection pads 240, but embodiments are not limited thereto.

In some example embodiments, an insulating material 500 fills a space between the first substrate 100 and one or more second substrates 200 of the second substrates 200 and spaces between the second connection pads 240. The insulating material 500 may be resin containing a high thermal conductive filler. In some example embodiments, an insulating material 500 may fill the space between the first substrate 100 and one or more of the second substrates 200 through an underfill process.

Figure 13:
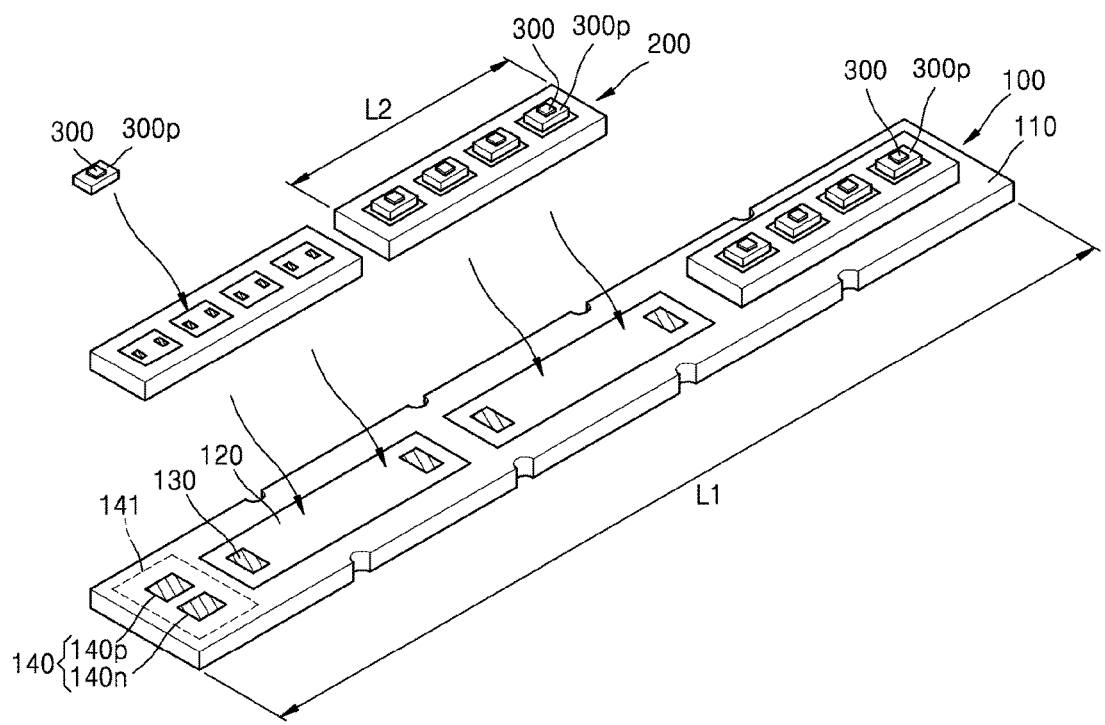
FIG. 13 is a perspective view that illustrates mounting of a plurality of second substrates and a plurality of package substrates on the upper surface of the first substrate of a light source module according to some example embodiments.

FIG. 13 is a perspective view that illustrates mounting of a plurality of second substrates 200 and a plurality of package substrates 300p on the upper surface of the first substrate 100 of a light source module according to some example embodiments.

Referring to FIG. 13, the light-emitting devices 300 are equipped with package substrates 300p thereon, the second substrates 200 equipped with the package substrates 300p are mounted on the substrate upper surface 110 of the first substrate 100 such that the second substrates 200 extend along a longitudinal axis of the first substrate 100, and thus a light source module having a long length along its respective longitudinal axis is manufactured.

According to some example embodiments, the light-emitting devices 300 are mounted on the second substrates 200, which are a double layer PCB in the form of a package on which the package substrates 300p are equipped by using bonding technology, and the second substrates 200 are mounted on the first substrate 100 having a long length along its respective longitudinal axis by using surface mounting technology, and thus a light source module having a long length along its respective longitudinal axis may be manufactured.

In some example embodiments, a method of manufacturing a light source module having a long length along its respective longitudinal axis may include a first process in which the light-emitting devices 300 are mounted on the package substrates 300p; a second process in which the package substrates 300p are mounted on the second substrates 200; and a third process in which the second substrates 200 are mounted on the first substrate 100. That is, the light-emitting device 300 may be mounted on a structure formed by stacking three substrates 100, 200, and 300p.

Figure 14:
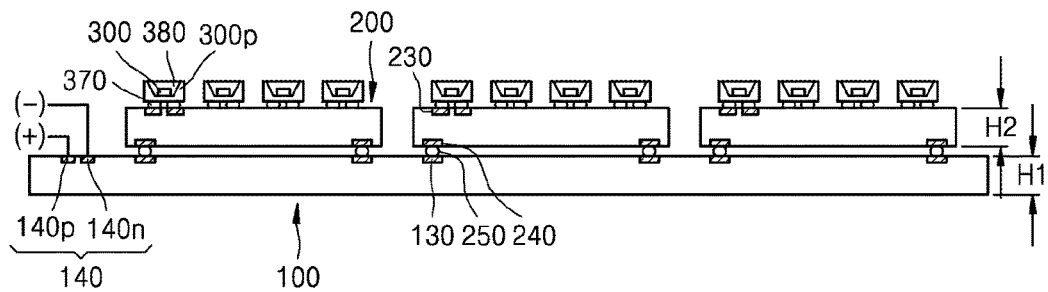
FIG. 14 is a cross-sectional view that illustrates the plurality of second substrates and the plurality of package substrates mounted on the upper surface of the first substrate of a light source module according to some example embodiments.

FIG. 14 is a cross-sectional view that illustrates the plurality of second substrates 200 and the plurality of package substrates 300p mounted on the upper surface of the first substrate 100 of a light source module according to some example embodiments.

Referring to FIG. 14, the package substrates 300p including the light-emitting devices 300 are mounted on the second substrates 200, and the second substrates 200 are mounted on the first substrate 100 such that the second substrates 200 extend along a longitudinal axis of the first substrate (e.g., extend in a longitudinal direction of the first substrate 100) by using surface mounting technology.

Each of the light-emitting devices 300 is mounted in a reflection cup of the package substrate 300p and may include a wavelength conversion unit 380 that seals the light-emitting device 300 on the package substrate 300p. The wavelength conversion unit 380 may contain a wavelength conversion material such as a fluorescent material and/or a quantum dot according to the need.

In particular, the quantum dot may have a core-shell structure by using a compound semiconductor. For example, the quantum dot may have a core including CdSe or InP; and a shell including ZnS or ZnSe. In some example embodiments, the quantum dot may include a ligand for stabilizing the core and the shell. The quantum dot may realize various colors depending on its size, and, particularly, when the quantum dot is used as a material for alternating fluorescent material, the quantum dot may be used as a red or green fluorescent material.

Descriptions of FIG. 14 that are substantially the same as those described above in relation to FIG. 12 will be omitted.

Figure 15:
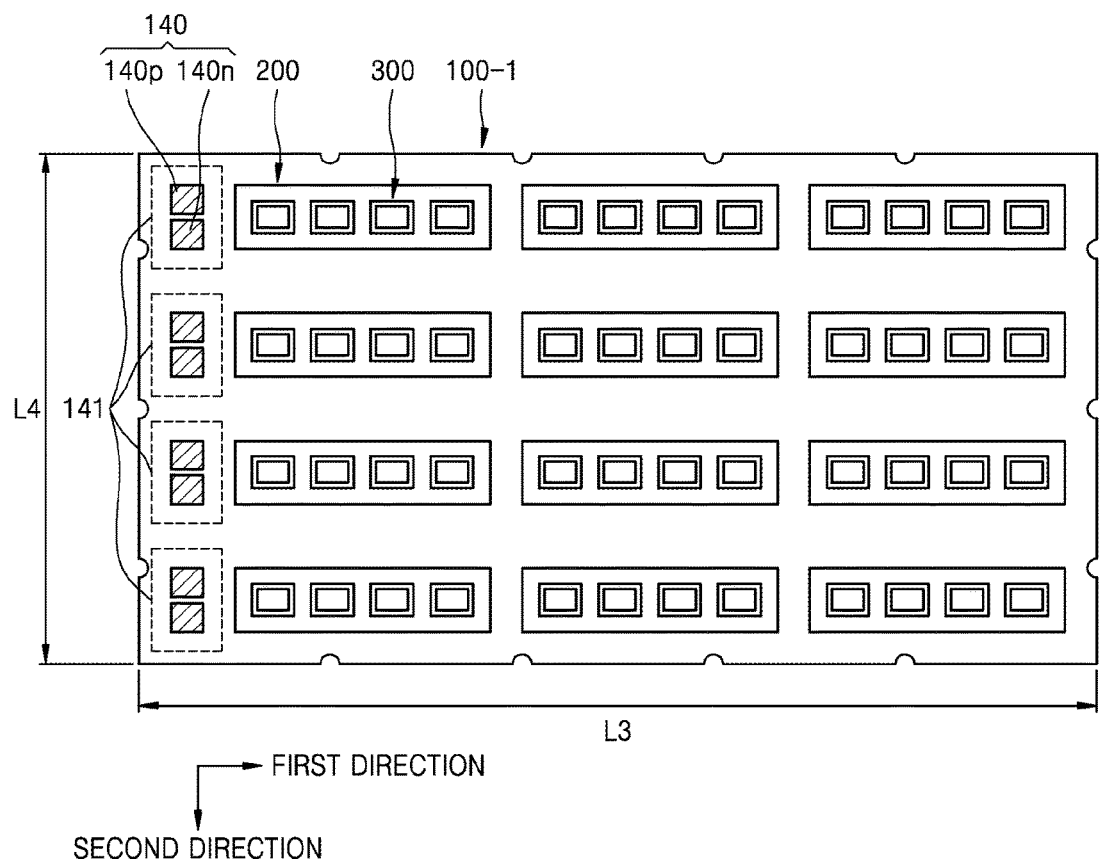
FIG. 15 and FIG. 16 are each a plan view that illustrates the plurality of second substrates mounted on the upper surface of the first substrate of a light source modules according to some example embodiments.
Figure 16:
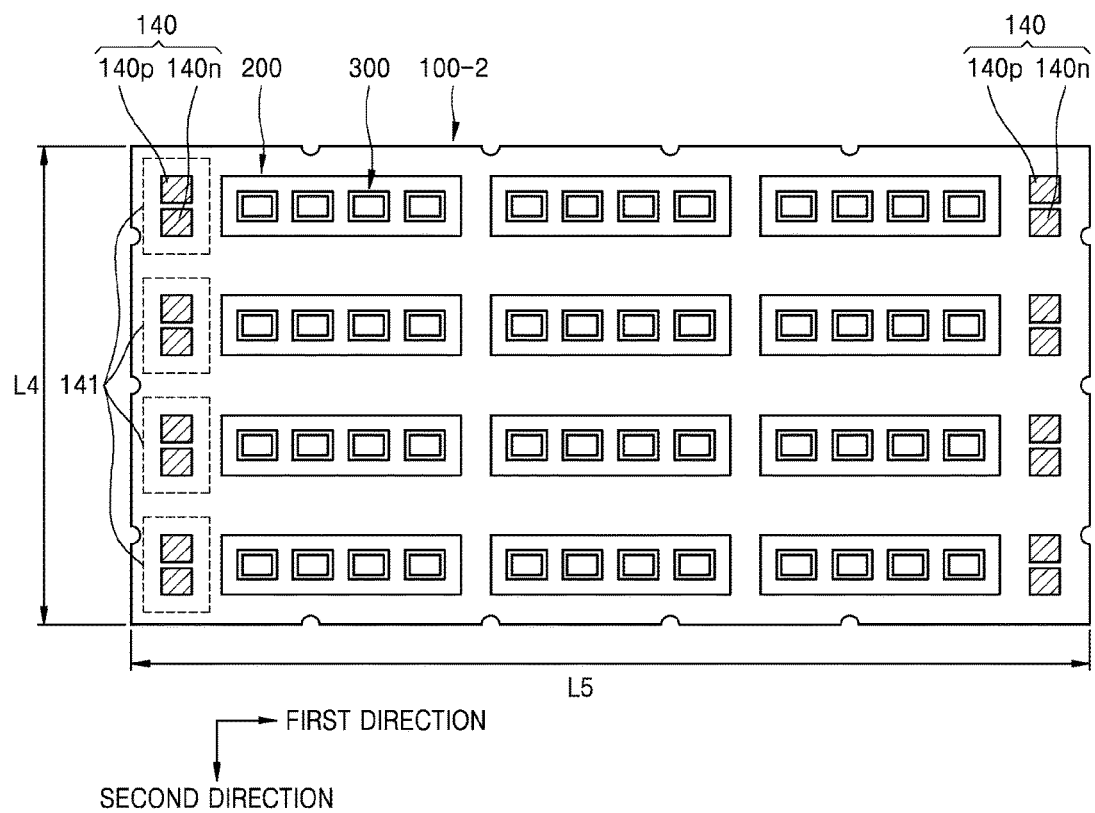

FIGS. 15 and 16 are each a plan view that illustrates the plurality of second substrates 200 mounted on the upper surface of the first substrate 100 of a light source modules according to some example embodiments.

In some example embodiments, a plurality of second substrates 200 on a first substrate 100 may be an array of second substrates 200 that extends in at least two directions on the first substrate. Referring to FIG. 15, for example, the second substrates 200 each equipped with the light-emitting device 300 thereon are mounted on an upper surface of a first substrate 100-1 having a particular (or, alternatively, predetermined) length L3 in a first direction and a particular (or, alternatively, predetermined) length L4 in a second direction at a constant interval in the first direction and the second direction of the first substrate 100-1. As shown the array of second substrates 200 may extend in both a first direction and a second direction on the first substrate 100.

The connectors 140 may be arranged in a second direction around one end of the first substrate 100-1. Each of the connectors 140 may be an external connection terminal that supplies external power to a plurality of the second substrates 20 mounted in a first direction in each row. In some example embodiments, the connectors 140 may be connected to electrode power source by one internal interconnection, and in this case, all the light-emitting devices 300 may operate at the same time. The connectors 140 may each include a positive electrode connector 140p that is connected to a positive electrode power source; and a negative electrode connector 140n that is connected to the negative electrode power source.

Generally, in the manufacture of a surface light emitting backlight assembly and a flat panel lighting device, a housing method that connects a plurality of light source modules may be used. However, the housing method has low manufacturing efficiency, and interconnections for supplying power to the plurality of light source modules need to be prepared separately.

In one embodiment, the light source module having a short length may be mounted in a plural number on the first substrate 100-1 having a particular (or, alternatively, predetermined) area, and thus one surface light emitting light source module may be manufactured.

Although a shape of the first substrate 100-1 and the number of second substrates 200 mounted thereon may be different, a light source module of the present embodiment is identical to or similar to the light source module having a long length along its respective longitudinal axis and including the first substrate 100 (see FIG. 11) described above, and thus the same description will be omitted.

Referring to FIG. 16, the second substrates 200 each equipped with the light-emitting device 300 thereon are mounted on an upper surface of a first substrate 100-2 having a particular (or, alternatively, predetermined) length L5 in a first direction and a particular (or, alternatively, predetermined) length L4 in a second direction at a constant interval in the first direction and the second direction of the first substrate 100-2, and the connectors 140 are disposed along both ends of the first substrate 100-2 in the second direction.

The connectors 140 may each include a positive electrode connector 140p that is connected to a positive electrode power source and a negative electrode connector 140n that is connected to a negative electrode power source.

In some example embodiments, each of the connectors 140 may have internal interconnections to be connected to some of the second substrates 200. That is the connectors 140 on the left side of FIG. 16 are connected to the second substrates 200 mounted on the left side, and the connectors 140 on the right side of FIG. 16 are connected to the second substrates 200 mounted on the right side. In this case, some of the light-emitting devices 300 may operate, and thus a light source may be controlled according to the need.

Figure 17:
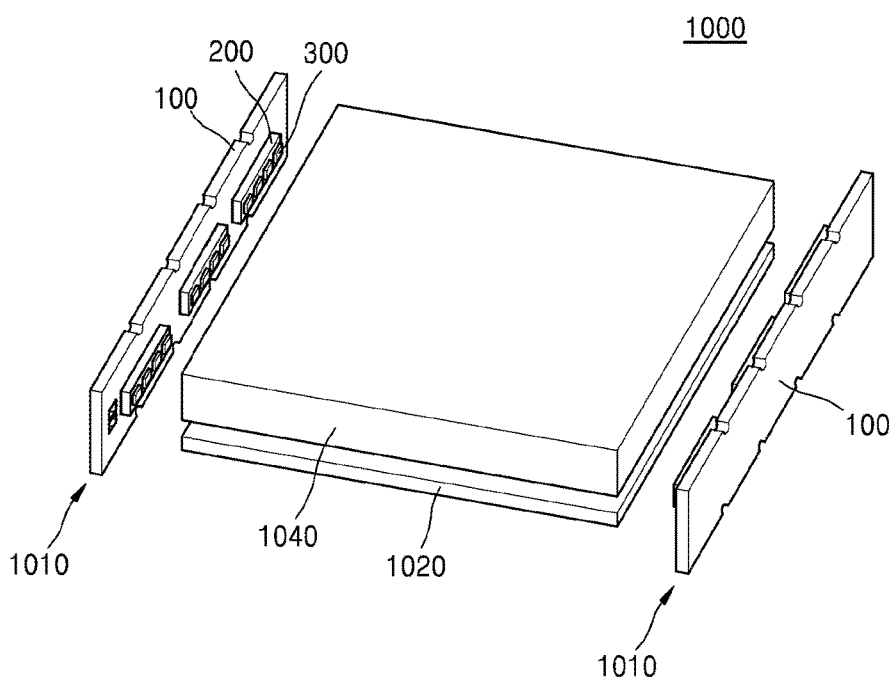
FIG. 17 is a perspective view that illustrates a backlight assembly including the light source module according to some example embodiments.

FIG. 17 is a perspective view that illustrates a backlight assembly 1000 including light source modules 1010 according to some example embodiments.

Referring to FIG. 17, the backlight assembly 1000 may include a light guide plate 1040; and light source modules 1010 that are each provided at two sides of the light guide plate 1040. In some example embodiments, the backlight assembly 1000 may further include a reflection plate 1020 that is disposed below the light guide plate 1040.

According to some example embodiments, the backlight assembly 1000 including the light source modules 1010 may be an edge-type backlight assembly. The light source module 1010 may be provided at only one side of the light guide plate 1040 or may be additionally provided at the other side of the light guide plate 1040.

As described with reference to FIGS. 1 to 16 above, the light source module 1010 may include a first substrate 100, a second substrate 200, and a light-emitting device 300. The light-emitting device 300 may be a light-emitting device as described with reference to FIGS. 5 to 7.

Figure 18:
FIG. 18 is a cross-sectional view that illustrates a direct-type backlight assembly including the light source module according to some example embodiments.

FIG. 18 is a cross-sectional view that illustrates a direct-type backlight assembly 1100 including light source module 1110 according to some example embodiments.

Referring to FIG. 18, the backlight assembly 1100 may include a light diffusion plate 1140; and light source modules 1110 that are arranged below the light diffusion plate 1140. In some example embodiments, the backlight assembly 1100 may further include a housing 1160 that is disposed below the light diffusion plate 1140 and accommodates the light source modules 1110.

According to some example embodiments, the backlight assembly 1100 including the light source modules 1110 may be a direct-type backlight assembly.

As described in FIGS. 1 to 16 above, the light source modules 1110 may include a first substrate 100, a second substrate 200, and a light-emitting device 300. Description of the light-emitting device 300 may be the same as that of the light-emitting device described with reference to FIGS. 5 to 7.

Figure 19:
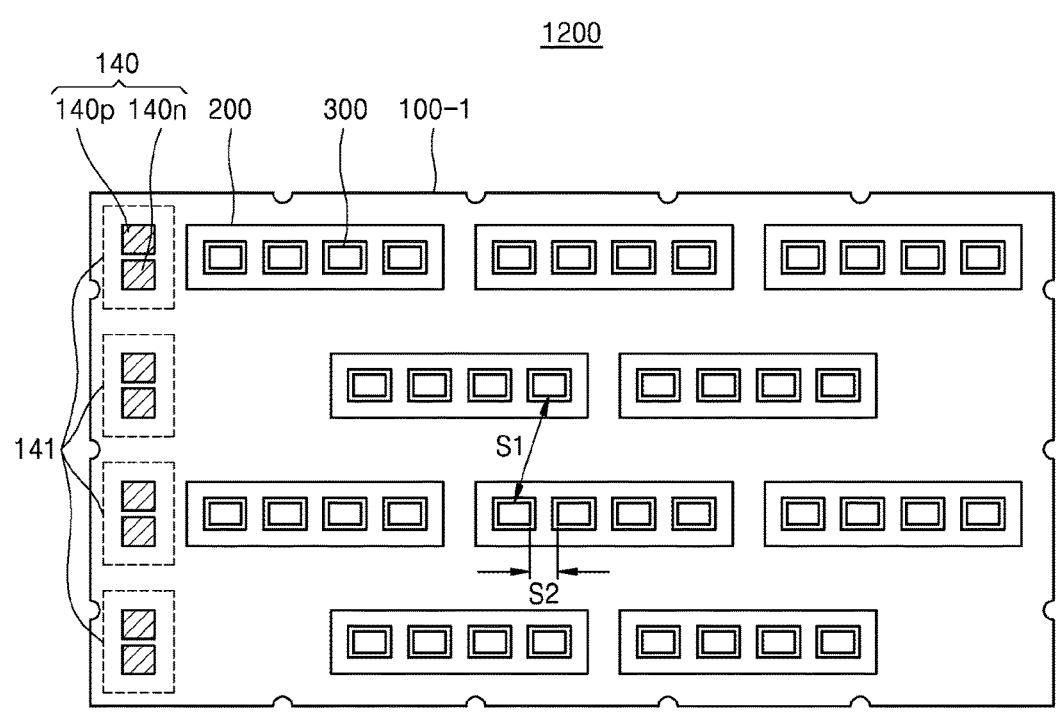
FIG. 19 is a plan view that illustrates an arrangement of a plurality of light-emitting devices of a direct-type backlight assembly including the light source module according to some example embodiments.

FIG. 19 is a plan view that illustrates an arrangement of a plurality of light-emitting devices 300 of a direct-type backlight assembly 1200 including the light source modules according to some example embodiments.

Referring to FIG. 19, an arrangement of light-emitting devices 300 in the direct-type backlight assembly 1200 is shown. Description of the light-emitting device 300 may be the same as the light-emitting device described above with reference to FIGS. 5 to 7.

The direct-type backlight assembly 1200 including a light source module according to some example embodiments may include a plurality of second substrates 200 having he light-emitting devices 300 equipped thereon on the first substrate 100-1. An arrangement of the second substrates 200 including the light-emitting devices 300 may have a matrix structure arranged in rows and columns, where each of the rows and columns has a zigzag shape. Four of the light-emitting devices 300 may be arranged in the same shape on the second substrate 200, and the rows and columns of the second substrates 200 may be understood as those are not arranged in one straight line.

In the direct-type backlight assembly 1200, to improve uniformity of brightness and light efficiency, the arrangement and interval of the second substrates 200 may vary from each other. In some example embodiments, distances S1 and S2 between adjacent light-emitting devices 300 may be optimized to secure uniformity of brightness in addition to the arrangement of the light-emitting devices 300. In this regard, when the rows and columns of the second substrates 200 including the light-emitting devices 300 are not arranged in one straight line but arranged in a zigzag shape, the number of light-emitting devices 300 may be about 15% to about 25% reduced with respect to the same light-emitting area.

Figure 20:
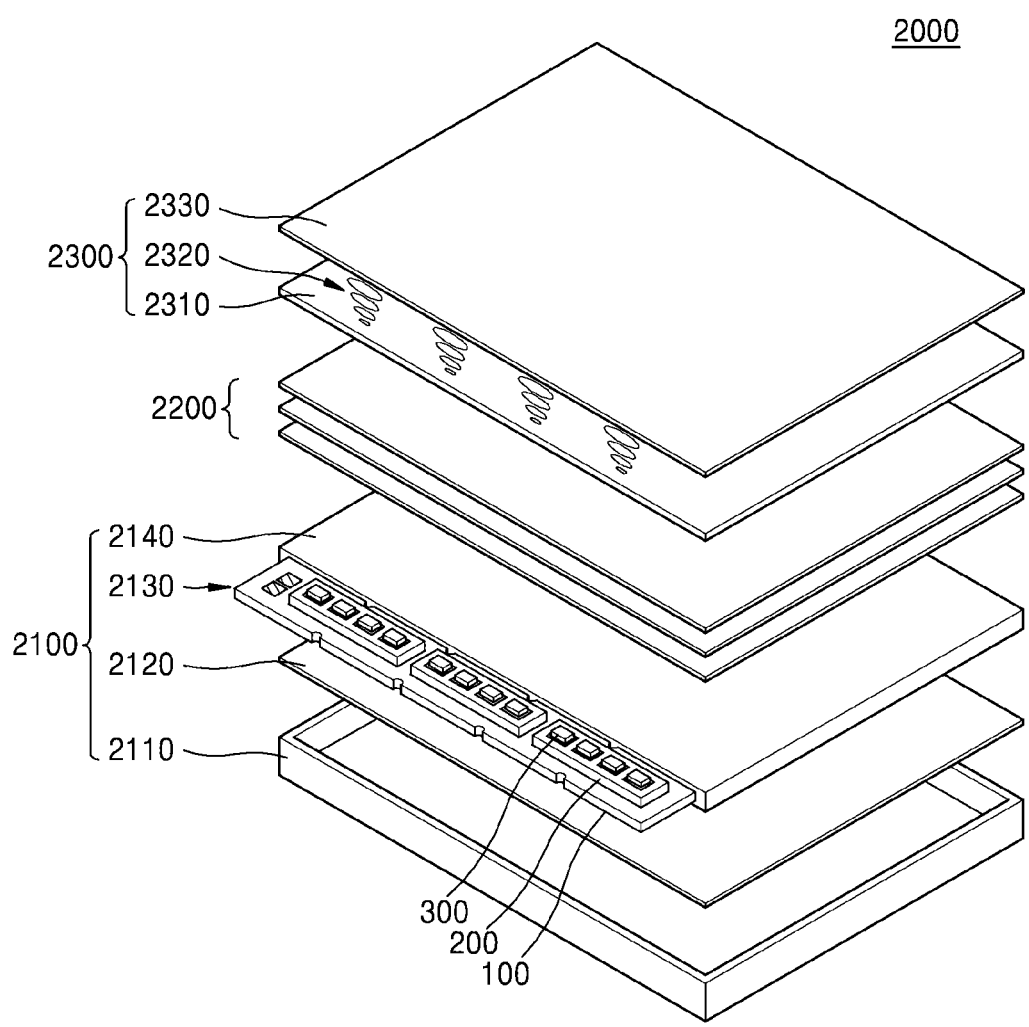
FIG. 20 is an exploded perspective view of a display device including the light source module according to some example embodiments.

FIG. 20 is an exploded perspective view of a display device 2000 including the light source module 2130 according to some example embodiments.

Referring to FIG. 20, generally, a display device 2000 may include a backlight assembly 2100, an optical sheet 2200, and an image display panel such as a liquid crystal panel. In some example embodiments, the backlight assembly 2100 may include a light source module 2130 that is provided on a least one side surface of a housing 2110, a reflection plate 2120, a light guide plate 2140, and a light guide plate 2140.

As described above with reference to FIGS. 1 to 16, the light source module 2130 may include a first substrate 100, a second substrate 200, and a light-emitting device 300. Particularly, the light-emitting device 300 may be a side-view type that is mounted on an adjacent side surface of the light guide plate 2140. Description of the light-emitting device 300 may be the same as that of the light-emitting device described with reference to FIGS. 5 to 7.

The optical sheet 2200 may include a various type of sheets such as a prism sheet or a protection sheet.

The image display panel 2300 may display an image by using light that has been reflected from the optical sheet 2200. The image display panel 2300 may include an array substrate 2310, a liquid-crystal layer 2320, and a color filer substrate 2330. The array substrate 2310 may include pixel electrodes that are arranged in the form of a matrix, thin film transistors that apply a driving voltage to the pixel electrode, and signal lines for operating the thin film transistors.

The color filter substrate 2330 may include a transparent substrate, a color filter, and a common electrode. The color filter may include filters for selectively permit lights of particular wavelengths from white light that is emitted from the backlight assembly 2100. The liquid-crystal layer 2320 may be re-arranged by an electrical field formed between the pixel electrode and the common electrode and thus may control the light transmittance. Light having the controlled light transmittance passes the color filter of the color filter substrate 2330, and thus an image may be displayed. The image display panel 2300 may further include a driving circuit unit that processes an image signal.

The display device 2000 including the light source module 2130 according to some example embodiments may allow the emitted light to be blue, green, or red of a high color purity after passing through the color filter substrate 2330 by using the light-emitting device 300 that emits blue light, green light, and red light having a relatively small full width at half maximum (FWHM).

Figure 21:
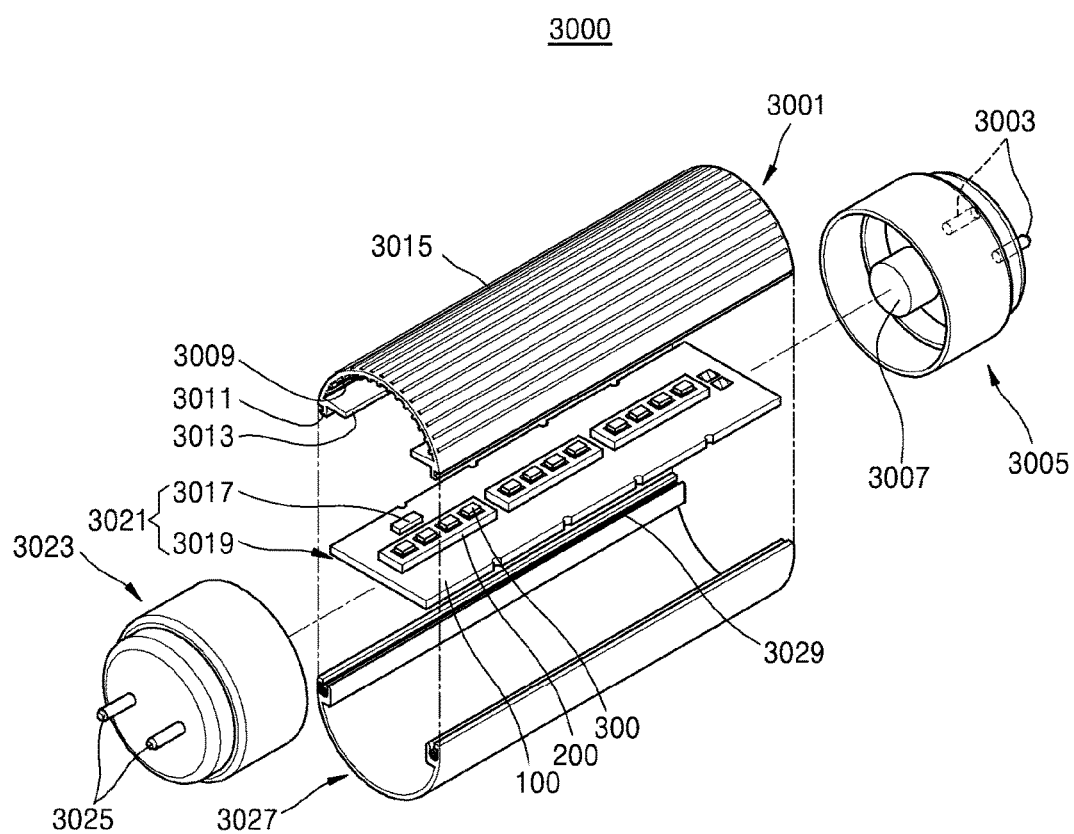
FIG. 21 is an exploded perspective view of a bar-type lighting device including the light source module according to some example embodiments.

FIG. 21 is an exploded perspective view of a bar-type lighting device 3000 including the light source module 3021 according to some example embodiments.

Referring to FIG. 21, the lighting device 3000 may include a heat-releasing member 3001, a cover 3027, the light source module 3021, a first socket 3005, and a second socket 3023.

A plurality of heat-releasing pins 3009 and 3015 may be formed in the form of bumps on an internal and/or external surface of the heat-releasing member 3001, and the heat-releasing pins 3009 and 3015 may be designed to have various shapes and intervals. Supports 3013 in the form of protrusions are disposed inside the heat-releasing member 3001. A light source module 3021 may be fixed on the supports 3013. Locking tabs 3011 may be disposed at both ends of the heat-releasing member 3001.

Locking grooves are formed in the cover 3027, and the locking tabs 3011 of the heat-releasing member 3001 may be coupled in the locking grooves 3029 in a hook coupling structure. Positions of the locking grooves 3029 and the locking tabs 3011 may be switched with each other.

As described above with reference to FIGS. 1 to 16, the light source module 3021 may include a first substrate 100, a second substrate 200, and a light-emitting device 300. The light source module 3021 may further include a controller 3017. The controller 3017 may be disposed on the first substrate 100. The controller 3017 may store driving information of the light-emitting device 300. Circuit interconnections for operating the light-emitting device 300 may be formed on the first substrate 100. In some example embodiments, components for operating the light-emitting device 300 may be included in the first substrate 100. Description of the light-emitting device 300 may be the same as that of the light-emitting device described with reference to FIGS. 5 to 7.

The first and second sockets 3005 and 3023 are a pair of sockets that have structures of being coupled to both ends of a cylindrical cover unit including the heat-releasing member 3001 and the cover 3027. For example, the first socket 3005 may include an electrode terminal 3003 and a power device 3007, and a dummy terminal 3025 may be disposed on the second socket 3023.

In some example embodiments, a photosensor and/or a communication module may be equipped in any one socket of the first socket 3005 or the second socket 3023. In some example embodiments, a photosensor and/or a communication module may be equipped in the second socket 3023, on which the dummy terminal 3025 is disposed. In some example embodiments, a photosensor and/or a communication module may be equipped in the first socket 3005, on which the electrode terminal 3003 is disposed.

Figure 22:
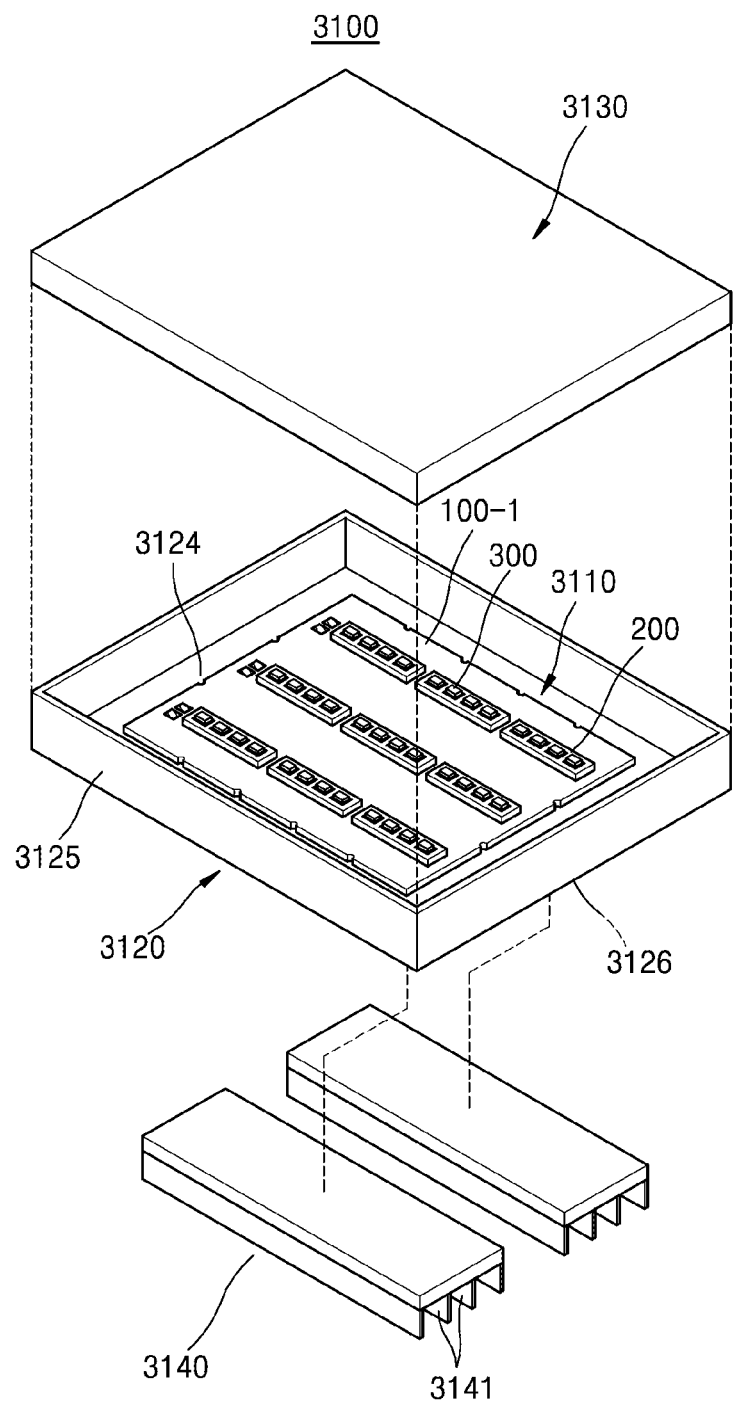
FIG. 22 is an exploded perspective view of a flat lighting device including the light source module according to some example embodiments.

FIG. 22 is an exploded perspective view of a flat lighting device 3100 including the light source module 3110 according to some example embodiments.

Referring to FIG. 22, the flat lighting device 3100 may have a structure of a surface light source type and may include the light source module 3110, a housing 3120, a cover 3130, and a heat sink 3140.

As described above with reference to FIGS. 1 to 16, the light source module 3110 may include a first substrate 100, 100-1, or 100-2, a second substrate 200, and a light-emitting device 300. The light source module 3110 may have a plurality of first substrates 100 or a single first substrate 100-1 or 100-2.

The housing 3120 may have a box shape including a bottom surface 3124 on which the light source module 3110 is mounted; and side surfaces 3125 that are extended around the bottom surface 3124. The housing 3120 may be formed of a material having excellent thermal conductivity to release heat generated from the light source module 3110 to the outside, and an example of the material may be a metal material.

A hole (not shown) to which the heat sink 3140 is inserted and coupled may be formed penetrating through the bottom surface 3124 of the housing 3120. In some example embodiments, the light source module 3110 mounted on the bottom surface 3124 may be partially coupled with the hole.

The cover 3130 is coupled to the side surface 3125 of the housing 3120 to cover the light source module 3110. In some example embodiments, the cover may have a flat structure as a whole.

The heat sink 3140 may be coupled to the hole through a lower surface 3126 of the housing 3120. In some example embodiments, when the heat sink 3140 contacts the light source module 3110 through the hole, heat of the light source module 3110 may be released to the outside. In order to increase heat-releasing efficiency, the heat sink 3140 may include a plurality of heat-releasing pins 3141. The heat sink 3140 may be formed of a material having an excellent thermal conductivity as well as the housing 3120.

As described above about the lighting device, a lighting device using a light source module may be generally classified into for in-door use and for out-door use according to the use. Examples of a lighting device for in-door use may include a bulb-type lamp, a fluorescent light, and a flat-type lighting device, and examples of a lighting device for out-door use may include street lights, security lights, flood lights, landscape lights, and traffic lights.

In some example embodiments, the lighting device using a light source module may be used as an internal and/or external light source for vehicles. The internal light source may be used as interior light, reading light, and various light source of dashboard, and the external light source for vehicles may be used in all light sources such as headlights, brake lights, turn signals, fog lights, or running lights.

In addition, the light source used in a robot or various mechanical equipment may use a lighting device using a light source module. In particular, a lighting device using a particular wavelength band may promote growth of plants and may calm moods or treat a disease of a human as a mood light.

The lighting device using a light source module may have different optical designs depending on the product shape, place of use, and purpose of use. Regarding the mood light, light may be controlled by using a technique of controlling color, temperature, brightness, and color of the light and a wireless controlling technique using a mobile device such as a smartphone.

In some example embodiments, when a communication function is added to a display device in addition to the lighting device using a light source module, a visible light wireless communication technique for achieving the proper purpose of a light-emitting device and a purpose as a communication means. This is because the light-emitting device has a long lifespan and excellent power efficiency and may have various colors compared to those of conventional light sources. In some example embodiments, the light-emitting device has a fast switching rate for digital communication and may be digitally controlled.

The visible light wireless communication technique is a wireless communication technique that may transfer information in a wireless manner by using light of a visible light wavelength band that may be recognized by human eyes. The visible light wireless communication technique is different from a conventional wired light communication technique and infrared light wireless communication in terms of using light of a visible light wavelength band and is different from a wired light communication technique in terms of having wireless as the communication environment.

In some example embodiments, the visible light wireless communication technique is convenient and has excellent physical security due to the free use without regulation or permission of using frequency, unlike RF wireless communication, has its significance of allowing a user to confirm the communication link, and has characteristics of a fusion technique that may simultaneously achieve the proper purpose of a light source and a communication function.

While the inventive concepts have been particularly shown and described with reference to embodiments thereof, it will be understood that various changes in form and details may be made therein without departing from the spirit and scope of the following claims.

What is claimed is:

1. A light source module, comprising:
 a first substrate including,
  a plurality of connectors configured to at least receive a supply of electrical power, and
  a plurality of first connection pads configured to be electrically connected to the plurality of connectors;
 a plurality of second substrates on the first substrate, each second substrate including,
  a plurality of light-emitting devices on an upper surface of the second substrate, wherein each light-emitting device is a chip,
  a plurality of second connection pads on a lower surface of the second substrate, the plurality of second connection pads configured to be electrically connected to the plurality of light-emitting devices, the lower surface of the second substrate being on an opposite side of the second substrate in relation to the upper surface of the second substrate, and
  a plurality of vias extending through an interior of the second substrate between the lower surface of the second substrate and the upper surface of the second substrate, the plurality of vias configured to electrically connect the plurality of light-emitting devices to separate, respective sets of second connection pads of the plurality of second connection pads; and
 a plurality of connection members configured to electrically connect the plurality of first connection pads of the first substrate with the plurality of second connection pads of the plurality of second substrates.

2. The light source module of claim 1, wherein,
the first substrate is a single layer printed circuit board (PCB),
the plurality of connectors and the plurality of first connection pads are on a common surface of the first substrate, and
the second substrate is a double layer PCB.

3. The light source module of claim 1, wherein the plurality of connection members include solder balls or solder bumps.

4. The light source module of claim 3 further comprising:
an insulating material between the first substrate and at least one second substrate of the plurality of the second substrates, the insulating material further between the plurality of connection members.

5. The light source module of claim 1, wherein the second substrate is surface mounted on the first substrate.

6. The light source module of claim 1, wherein the plurality of light-emitting devices are mounted on the upper surface of the second substrate according to flip-chip bonding.

7. The light source module of claim 1, wherein,
the plurality of light-emitting devices extends along a longitudinal axis of the second substrate, and
the plurality of second substrates extends along a longitudinal axis of the first substrate.

8. The light source module of claim 7, wherein the plurality of connectors are located in at least one end region of the first substrate.

9. A light source module, comprising:
a first substrate including,
a plurality of connectors configured to at least receive a supply of electrical power, and
a plurality of first connection pads configured to be electrically connected to the plurality of connectors;
a plurality of second substrates on the first substrate, each second substrate including,
a plurality of package substrates on an upper surface of the second substrate,
a plurality of light-emitting devices on the plurality of package substrates, each light-emitting device on a separate package substrate of the plurality of package substrates,
a plurality of second connection pads on a lower surface of the second substrate, the plurality of second connection pads configured to be electrically connected to the plurality of light-emitting devices, the lower surface of the second substrate being on an opposite side of the second substrate in relation to the upper surface of the second substrate, and
a plurality of vias extending through an interior of the second substrate between the lower surface of the second substrate and the upper surface of the second substrate, the plurality of vias configured to electrically connect the plurality of light-emitting devices to separate, respective sets of second connection pads of the plurality of second connection pads;
a plurality of connection members configured to electrically connect the plurality of first connection pads of the first substrate with the plurality of second connection pads of the plurality of second substrates.

10. The light source module of claim 9, wherein each package substrate includes a wavelength conversion material that covers each light-emitting device of the plurality of light emitting devices.

11. The light source module of claim 10, wherein the wavelength conversion material includes a fluorescent material or a quantum dot.

12. The light source module of claim 9, wherein,
the first substrate is a single layer PCB,
the plurality of connectors and the plurality of first connection pads are on a common surface of the first substrate, and
the second substrate is a double layer PCB.

13. The light source module of claim 9, wherein the second substrate is surface mounted on the first substrate.

14. A light source module, comprising:
a first substrate including,
a plurality of connectors configured to at least receive a supply of electrical power, and
a plurality of first connection pads configured to be electrically connected to the plurality of connectors;
a plurality of second substrates on the first substrate, each second substrate including,
a plurality of mounting elements on an upper surface of the second substrate, each mounting element configured to electrically connect with a separate light-emitting device that is a chip,
a plurality of second connection pads on a lower surface of the second substrate, each second connection pad configured to be electrically connected to a separate mounting element of the plurality of mounting elements, the lower surface of the second substrate being on an opposite side of the second substrate in relation to the upper surface of the second substrate, and
a plurality of vias extending through an interior of the second substrate between the lower surface of the second substrate and the upper surface of the second substrate, the plurality of vias configured to electrically connect the plurality of mounting elements to separate. respective sets of second connection pads of the plurality of second connection pads; and
a plurality of connection members configured to electrically connect the plurality of first connection pads of the first substrate with the plurality of second connection pads of the plurality of second substrates.

15. The light source module of claim 14, wherein,
the first substrate is a single layer printed circuit board (PCB),
the plurality of connectors and the plurality of first connection pads are on a common surface of the first substrate, and
the second substrate is a double layer PCB.

16. The light source module of claim 14 further comprising:
an insulating material between the first substrate and at least one second substrate of the plurality of the second substrates, the insulating material further between at least a portion of connection members of the plurality of connection members.

17. The light source module of claim 14, wherein,
each second substrate is configured to electrically connect to a separate plurality of light-emitting devices such that the separate plurality of light-emitting devices extends along a longitudinal axis of the second substrate, and
the plurality of second substrates extends along a longitudinal axis of the first substrate.

18. The light source module of claim 17, wherein,
the plurality of second substrates is an array of second substrates that extends in both a first direction and a second direction on the first substrate, and the second direction is perpendicular to the first direction.

19. The light source module of claim 14, wherein the plurality of connectors are located in at least one end region of the first substrate.

\* \* \* \* \*